US012787223B2

(12) United States Patent
Ide et al.

(10) Patent No.: US 12,787,223 B2
(45) Date of Patent: Nov. 3, 2026

(54) EBULLITION COOLING DEVICE

(71) Applicant: Lotus Thermal Solution Inc., Osaka (JP)

(72) Inventors: Takuya Ide, Osaka (JP); Masaaki Murakami, Osaka (JP); Tomiyuki Numata, Osaka (JP)

(73) Assignee: LOTUS THERMAL SOLUTION INC., Osaka (JP)

( * ) Notice: Subject to any disclaimer, the term of this patent is extended or adjusted under 35 U.S.C. 154(b) by 56 days.

(21) Appl. No.: 18/290,079

(22) PCT Filed: Apr. 28, 2022

(86) PCT No.: PCT/JP2022/019409
§ 371 (c)(1),
(2) Date: Nov. 9, 2023

(87) PCT Pub. No.: WO2022/244621
PCT Pub. Date: Nov. 24, 2022

(65) Prior Publication Data

US 2024/0251525 A1 Jul. 25, 2024

(30) Foreign Application Priority Data

May 18, 2021 (JP) ................................ 2021-083732

(51) Int. Cl.
*H05K 7/20* (2006.01)
*B81C 1/00* (2006.01)

(52) U.S. Cl.
CPC ........ *H05K 7/2029* (2013.01); *B81C 1/00119* (2013.01); *H05K 7/203* (2013.01)

(58) Field of Classification Search
CPC ... H05K 7/2029; H05K 7/203; B81C 1/00119
(Continued)

(56) References Cited

U.S. PATENT DOCUMENTS 4,949,164 A * 8/1990 Ohashi .................. H01L 23/427
165/80.4
7,261,141 B2 8/2007 Nakajima
(Continued)

FOREIGN PATENT DOCUMENTS

JP 4235813 B2 3/2009
JP 2012-013396 A 1/2012
(Continued)

OTHER PUBLICATIONS

International Search Report for International Application No. PCT/JP2022/019409 dated Jul. 12, 2022 (2 sheets, 2 sheets translation).

*Primary Examiner* — Joel M Attey
(74) *Attorney, Agent, or Firm* — Kratz, Quintos & Hanson, LLP

(57) ABSTRACT

In an ebullition cooling device, one opening of each of through holes faces an uneven surface, and the other opening of each of the through holes is opened to a space on a side opposite to the uneven surface. At least the uneven surface of a heat transfer wall and a metal porous body are immersed in a refrigerant liquid. The uneven surface of the heat transfer wall is a vertical surface or an inclined surface having a height position that changes in one direction along which grooves extend, and at least one end, at a higher position, of opposite ends of each of the grooves in the direction along which the grooves extend is opened.

4 Claims, 7 Drawing Sheets

(58) Field of Classification Search
USPC .................................................... 165/104.26
See application file for complete search history.

(56) References Cited

U.S. PATENT DOCUMENTS

| | | | | |
|---|---|---|---|---|
| 2005/0145364 | A1* | 7/2005 | Nakajima ............ | B22D 25/005<br>164/79 |
| 2020/0214169 | A1* | 7/2020 | Tsunoda ............ | H05K 7/20245 |

FOREIGN PATENT DOCUMENTS

| | | | |
|---|---|---|---|
| JP | 2013-243249 | A | 12/2013 |
| JP | 2017-015269 | A | 1/2017 |
| JP | 2018-204882 | A | 12/2018 |

* cited by examiner

EBULLITION COOLING DEVICE

TECHNICAL FIELD

The present invention relates to an ebullition cooling device using a refrigerant.

BACKGROUND ART

An ebullition cooling device is a device that includes a heat receiving portion to which a cooling target object is attached and a heat radiating portion. In the ebullition cooling device, a refrigerant liquid in contact with the heat receiving portion boils and evaporates to transmit heat to the heat radiating portion. Efficient ebullition and evaporation improve thermal conductivity, that is, improve a cooling efficiency.

Conventionally, it has been proposed that a large number of holes are provided in the heat receiving portion to form an uneven rough surface, to thereby promote ebullition and evaporation (see Patent Literatures (PTLs) 1 to 3, for example). In particular, in PTL 3, a metal porous body is attached over the uneven surface of a heat transfer wall, so as to form uneven spaces that intersect with each other. With this configuration, it is confirmed that ebullition and evaporation are further promoted, thereby improving the cooling performance.

However, heat generation density in recent electronic devices such as server computers and inverters of electric vehicles continues to rise without stopping, and there is a demand for further improvement in the cooling efficiency.

CITATION LIST

Patent Literature

PTL 1: Japanese Unexamined Patent Application Publication No. 2012-13396

PTL 2: Japanese Unexamined Patent Application Publication No. 2017-15269

PTL 3: Japanese Unexamined Patent Application Publication No. 2018-204882

SUMMARY OF INVENTION

Technical Problem

In view of the above situation, a purpose of the present invention is to provide an ebullition cooling device capable of further improving cooling performance.

Solution to Problem

The inventors of the present invention have studied the further improvement of the cooling performance in the ebullition cooling device according to the above-described PTL 3. In the ebullition cooling device, a refrigerant liquid is supplied to a space between a metal porous body and an uneven surface, and vapor (bubbles) is discharged from the space, via through holes in the metal porous body and grooves on the uneven surface. The refrigerant liquid and the vapor interfere with each other, especially when the amount of vapor increases. This causes fluid resistance to increase, and smooth circulation to be prevented. The inventors have considered that this might be a factor that limits the cooling performance.

As a result of further intensive study, the inventors have found that the generated vapor (bubbles) is smoothly moved and discharged along the grooves by the force of buoyancy by making the uneven surface be a vertical surface or an inclined surface in which its height position changes in one direction along which the grooves extend. This causes a pumping action to be generated, promoting supply of the refrigerant liquid through the through holes of the metal porous body, and also promoting circulation of the supply, evaporation, and discharge of the refrigerant. As a result, the inventors have found that the cooling performance can be further enhanced, and have completed the present invention.

Specifically, the present invention includes:

(1) An ebullition cooling device including: a heat receiving portion to which a cooling target object is attached; and a heat radiating portion to which heat is transmitted by ebullition and evaporation of a refrigerant liquid in contact with the heat receiving portion, in which the heat receiving portion includes: a heat transfer wall having an attachment surface to which the cooling target object is attached and an uneven surface having a plurality of grooves provided in a region excluding the attachment surface; and a metal porous body attached to be superimposed on the uneven surface of the heat transfer wall, the metal porous body having a plurality of through holes formed therein, one opening of each of the through holes facing the uneven surface, and the other opening of each of the through holes being opened to a space on a side opposite to the uneven surface, at least the uneven surface of the heat transfer wall and the metal porous body are immersed in the refrigerant liquid, and the uneven surface of the heat transfer wall is a vertical surface or an inclined surface having a height position that changes in one direction along which the grooves extend, and at least one end, at a higher position, of opposite ends of each of the grooves in the direction along which the grooves extend is opened.

(2) The ebullition cooling device according to the above (1), in which the uneven surface includes the plurality of grooves extending mutually in parallel, and the metal porous body is attached to the uneven surface with the opposite ends of the grooves being opened.

(3) The ebullition cooling device according to the above (1) or (2), in which the metal porous body is a lotus-type porous metal molded body molded by a metal solidification method, the lotus-type porous metal molded body having a plurality of pores that extend in one direction.

Advantageous Effects of Invention

In an ebullition cooling device according to the present invention as described above, even when an amount of generated vapor is large, in particular, the generated vapor (bubbles) can be smoothly moved and discharged by the force of buoyancy along grooves. A pumping action caused by movement and discharging of the vapor promotes supply of a refrigerant liquid via through holes of a metal porous body. This allows circulation of the supply, evaporation, and discharge of the refrigerant to be promoted as a whole, resulting in further enhancement of cooling performance.

DESCRIPTION OF EMBODIMENTS

Hereinafter, embodiments of the present invention are described in detail, with reference to the attached drawings.

Figure 1:
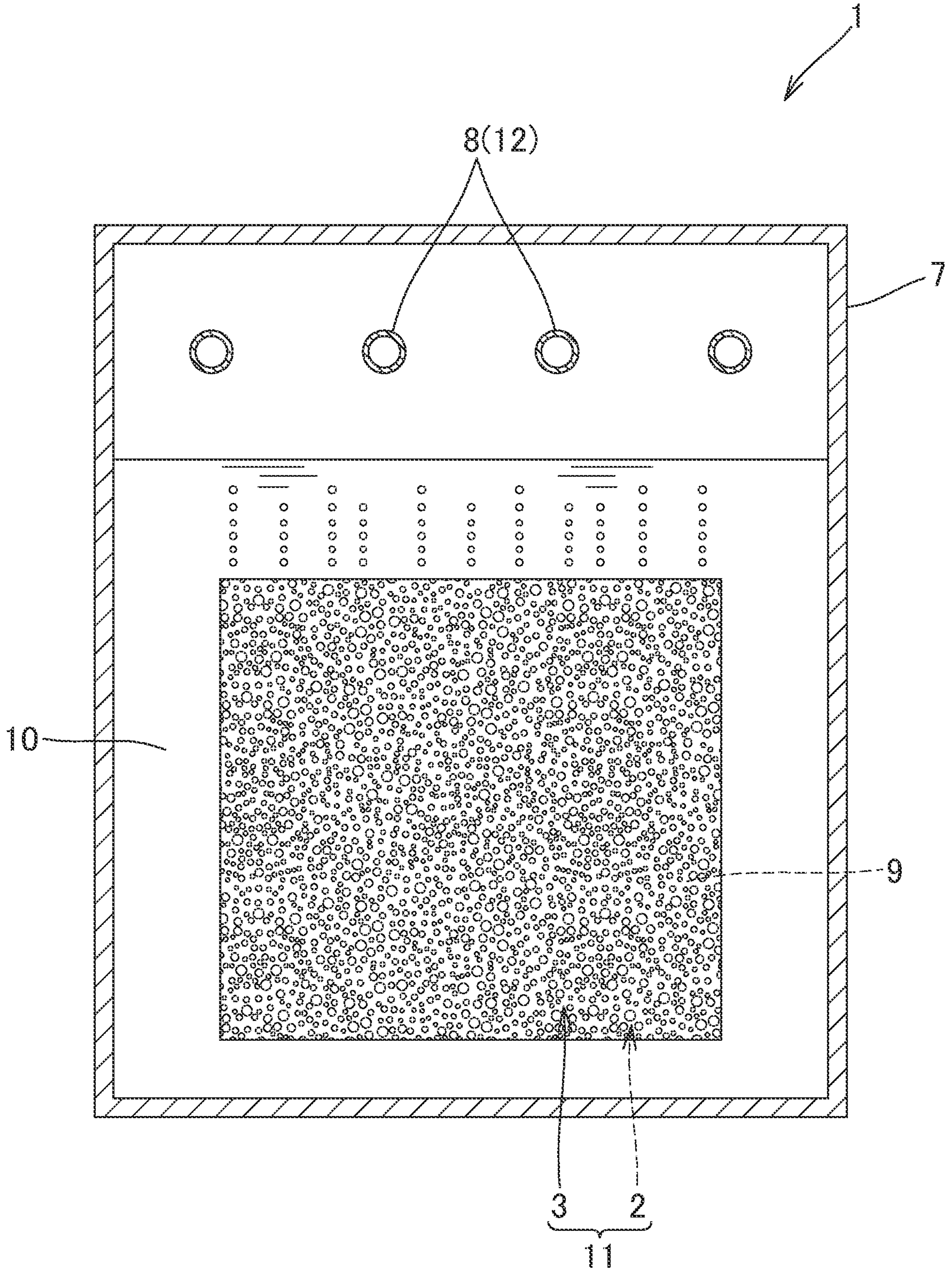
FIG. 1 is an explanatory diagram of an ebullition cooling device according to a representative embodiment of the present invention, viewed from a front.
Figure 2:
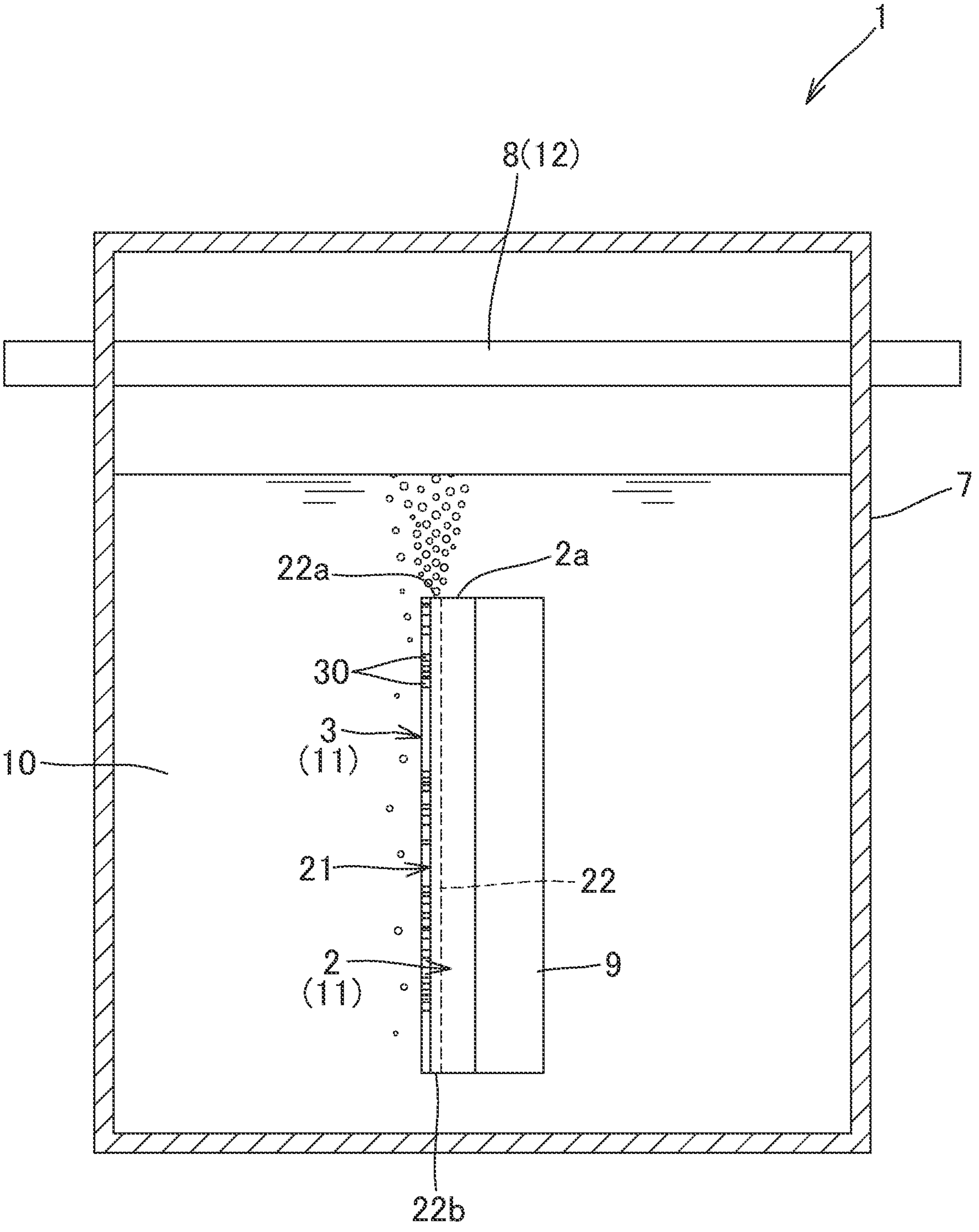
FIG. 2 is an explanatory diagram of the ebullition cooling device, viewed from a side.

As shown in FIGS. 1 and 2, an ebullition cooling device 1 according to the present invention includes: a heat receiving portion 11 to which a cooling target object 9 is attached; a heat radiating portion 12; and a refrigerant liquid 10. In the ebullition cooling device 1, the refrigerant liquid 10 in contact with the heat receiving portion 11 boils and evaporates to become bubbles, to thereby transmit heat to the heat radiating portion 12 as latent heat. In this example, the heat receiving portion 11 and the heat radiating portion 12 are installed in a storage container 7 in which the refrigerant liquid 10 is enclosed, and the cooling target object 9 is attached to the heat receiving portion 11.

The heat receiving portion 11 according to the present example may be attached to the cooling target object 9 that is completely immersed in the refrigerant liquid 10 inside the storage container 7, so as to be completely immersed in the refrigerant liquid 10 as well (immersion type). On the other hand, the cooling target object 9 may be attached to an outer surface of a container wall (side wall) of the storage container 7, and the container wall itself may be allowed to function as the heat receiving portion 11, to bring only the heat receiving portion (an inner surface thereof) in contact with the refrigerant liquid 10 (non-immersion type).

Figure 3:
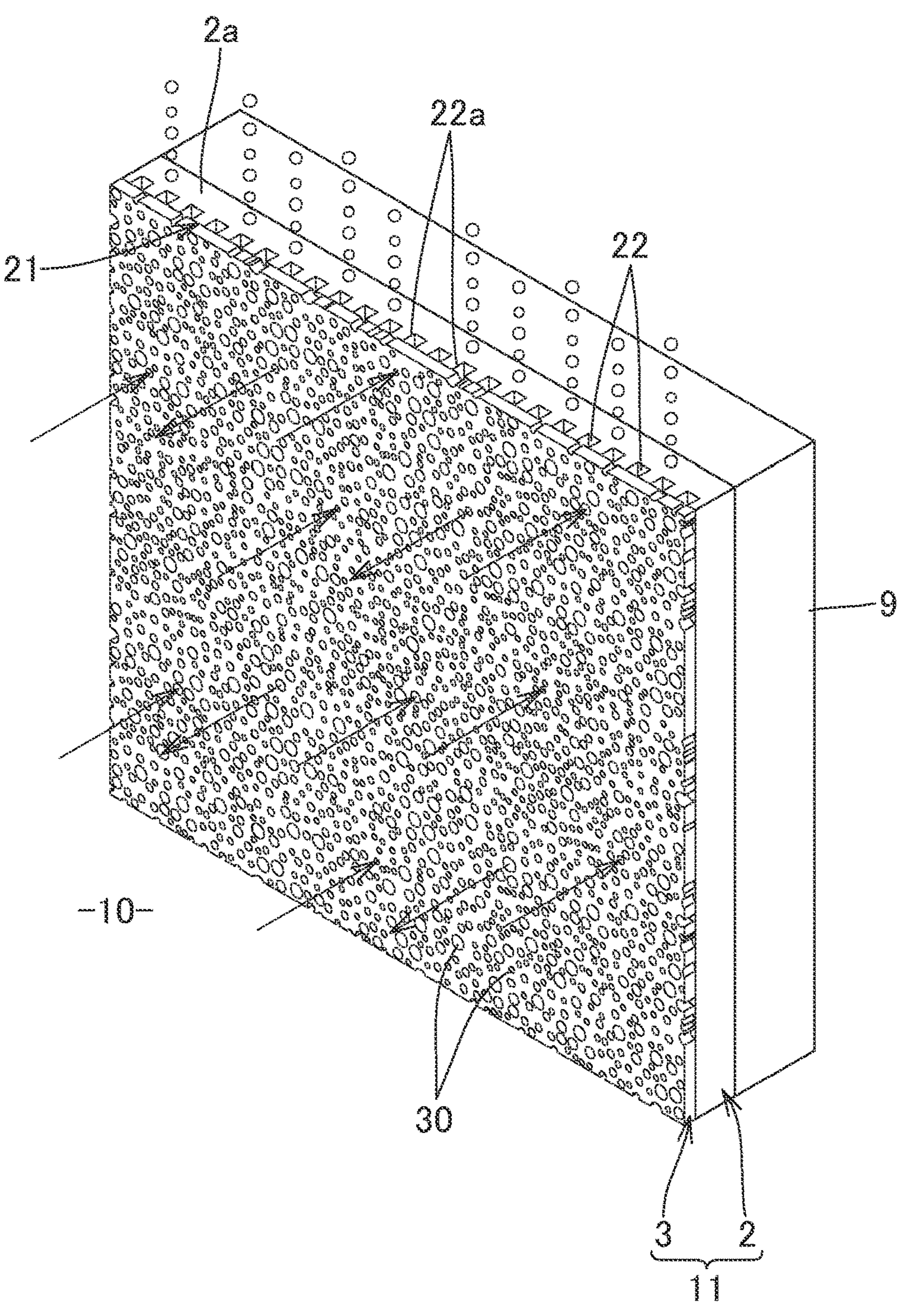
FIG. 3 is a perspective view showing a heat receiving portion including a heat transfer wall and a metal porous body, in the ebullition cooling device.
Figure 4:
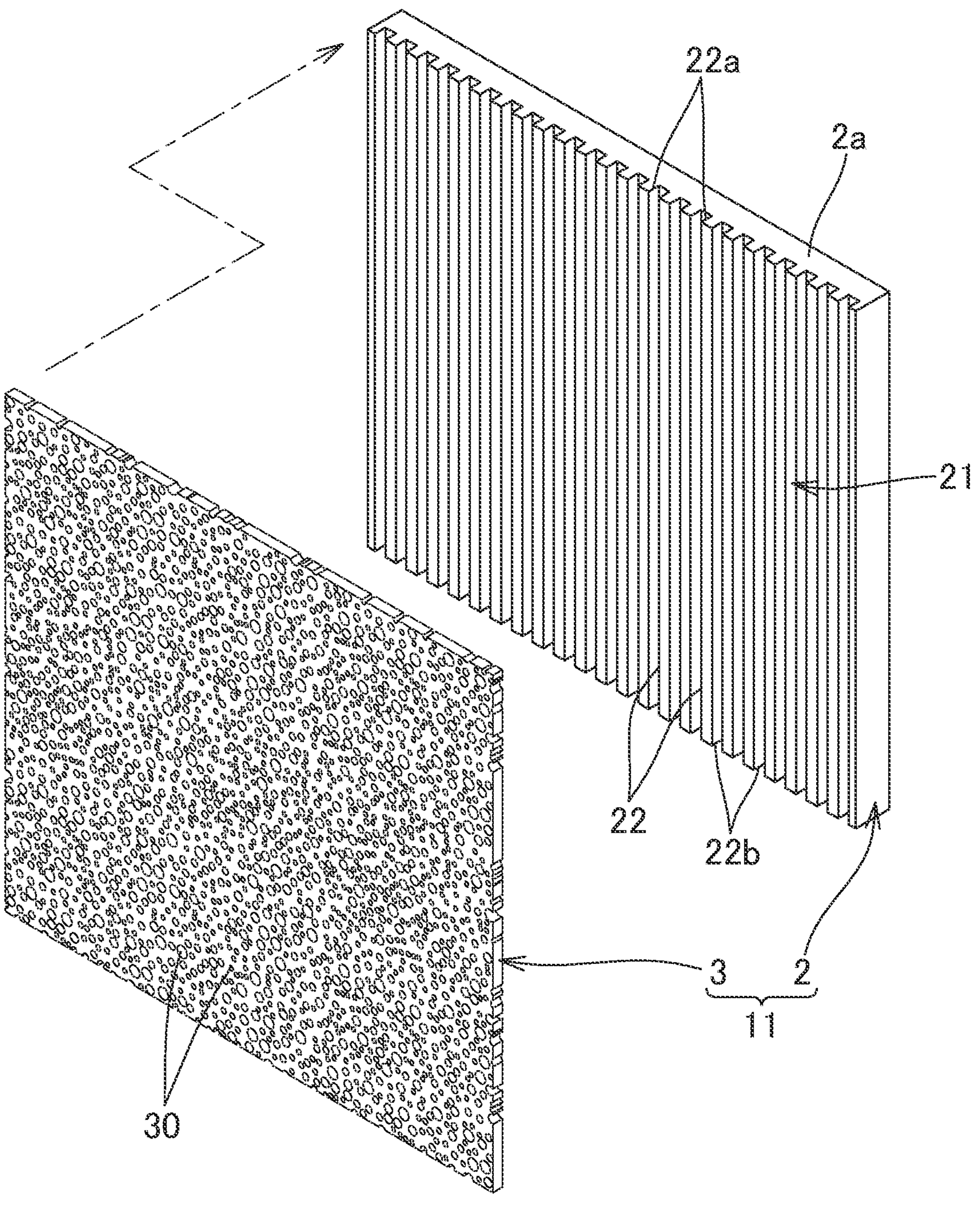
FIG. 4 is an exploded perspective view of the heat receiving portion.
Figure 5:
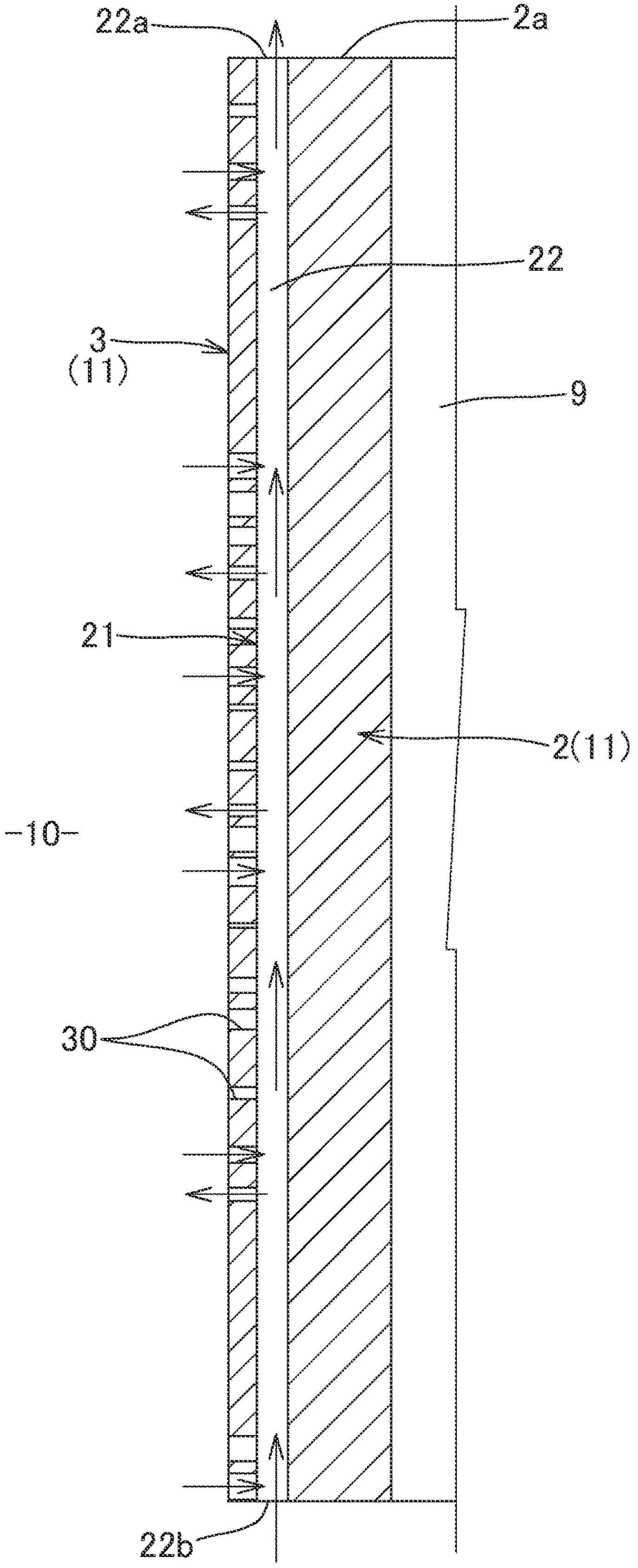
FIG. 5 is an explanatory diagram showing movement of a refrigerant in the heat receiving portion.

As also shown in FIGS. 3 to 5, the heat receiving portion 11 includes a heat transfer wall 2 and a metal porous body 3. To the heat transfer wall 2, the cooling target object 9 is attached, and the heat transfer wall 2 has an uneven surface 21 with which the refrigerant liquid 10 comes into contact. The metal porous body 3 is attached to be superimposed on the uneven surface 21 of the heat transfer wall 2.

Although the heat receiving portion 11 and the heat radiating portion 12 are provided in one storage container 7, containers each constituting the respective heat receiving portion 11 and heat radiating portion 12 may be connected by a pipe or the like, as long as the containers have internal spaces communicating with each other. In this case, the containers may communicate with each other via two flow paths including one through which a vaporized refrigerant flows from the heat receiving portion 11 toward the heat radiating portion 12, and the other through which the refrigerant having returned to liquid at the heat radiating portion 12 flows back to the heat receiving portion 11. In addition, a known communication form in conventional ebullition cooling devices can be widely applied.

As shown in FIGS. 1 and 2, the heat radiating portion 12 according to the present example is provided with a condensation pipe 8 through which cooling water flows. The vaporized (evaporated) refrigerant is brought into contact with the condensation pipe 8 and is deprived of heat and liquefied. However, the present invention is not limited to such a heat radiation form, and a known heat radiation form for the conventional ebullition cooling devices can be widely adopted. For example, a device may be used in which a heat radiating fin for radiating heat by blowing air is provided on the outer wall of a heat radiating portion, and the heat is absorbed from a refrigerant through the inner wall of the device.

It is possible to appropriately select and use a refrigerant (refrigerant liquid) from conventionally known refrigerants such as water, alcohol, and fluorocarbon refrigerants, depending on: a difference between the immersion type in which the cooling target object 9 is immersed and the non-immersion type in which the cooling target object 9 is not immersed; a structure, material, etc., of the cooling target object 9 when the immersion type is used; and a material of each of the heat receiving portion 11 and the heat radiating portion 12.

As shown in FIG. 4, the heat transfer wall 2 is made of a material with good thermal conductivity, and has an attachment surface 20 to which the cooling target object 9 is attached and the uneven surface 21 provided with a plurality of grooves 22 arranged in an area other than the attachment surface 20. In the present example, the heat transfer wall 2 is composed of a plate having the uneven surface 21 formed on a front side of the plate and the attachment surface 20 formed on a rear side of the plate.

The uneven surface 21 of the heat transfer wall 2 is a vertical surface or an inclined surface (vertical surface in this example), a height position of which changes in one direction along which the grooves 22 extend. The uneven surface 21 is composed of a plurality of grooves 22 that are independent of each other and extend in parallel to each other, and each groove 22 extends in the vertical direction.

In addition, at least upper ends 22*a*, which are at a higher position between both ends of the grooves 22 in the direction along which the grooves 22 extend, are opened to the outside (to an internal space of the container) from an upper end portion 2*a* of the heat transfer wall 2, so that vapor of the refrigerant can easily escape from the upper ends 22*a*. In this example, lower ends 22*b* are also opened downward, so that the refrigerant liquid 10 is easily supplied into the grooves 22.

The metal porous body 3 has a plurality of through holes 30 formed therein, and is attached to be superimposed on the uneven surface 21 (the front surface in the drawing) of the heat transfer wall 2, and one opening of each of the through holes 30 faces the uneven surface 21, and the other opening is opened to a space on the opposite side of the uneven surface 21. The metal porous body 3 has an outer shape and a dimension, which are the same as those of the uneven surface 21, and is provided so as to be completely superimposed on the uneven surface 21. Here, the dimension of the metal porous body 3 may be set larger or smaller than that of the uneven surface 21.

In the ebullition cooling device 1 according to the present embodiment, the boiling of the refrigerant mainly occurs at a contact portion of the uneven surface 21 with the metal porous body 3, i.e., a contact portion between the grooves 22. The boiling also occurs at an edge of each of the through holes 30, which is an interface with the refrigerant liquid at openings of the through holes 30 on a side opposite to the uneven surface 21. Then, as shown in FIG. 5, the vapor of the refrigerant is discharged to the outside from the through holes 30 of the metal porous body 3 or the open portion at the upper end of the grooves 22. The refrigerant liquid is supplied from the through holes 30 of the metal porous body 3 and the open portions at the upper and lower ends of the grooves 22.

The quantity of treated heat may be small and the amount of generated vapor may be small. In such a case, the vapor escapes to the outside through the nearest through holes 30 with smaller fluid resistance, rather than through long passages of the grooves 22, and the grooves 22 mainly function as a supply path of the refrigerant liquid. On the other hand, the quantity of the treated heat may increase and the amount of the generated vapor may increase. In such a case, the fluid resistance becomes smaller by allowing the vapor to escape through both the through holes 30 and the grooves 22. Thus, a function of the grooves 22 gradually changes to also bear the discharging of the vapor.

Once vapor droplets start rising in the grooves 22, the supply of the refrigerant liquid and the discharge of the vapor are vigorously held reflecting a pumping action due to the buoyancy, and the circulation of supply, evaporation, and discharge of the refrigerant is promoted as a whole. As a result, the cooling performance can be further enhanced. The through holes 30 bear both the supply of the refrigerant liquid and the discharge of the vapor, regardless of the quantity of the treated heat. In particular, according to a porous material of the lotus-type porous metal molded body, which will be described later, there are variations in pore diameters, so that the supply of the refrigerant liquid and the discharge of the vapor are shared between the through holes 30 having different inner diameters, thereby allowing the through holes 30 to efficiently function.

As materials used for the metal porous body 3, a wide range of metal materials with good thermal conductivity, such as aluminum, iron, and copper, which are used for pipes and fins of conventional heat exchangers, can be adopted. The through holes extending in one direction can be formed by a known method such as drilling or laser processing. However, in the present example, the metal porous body provided with through holes is made from a porous material obtained by cutting a lotus-type porous metal molded body that is molded by a metal solidification method and has a plurality of pores which extend in one direction, in a direction intersecting the direction along which the pores extend.

Such a lotus-type porous metal molded body can be molded by a known method such as a pressurized gas method (for example, the method disclosed in Japanese Patent No. 4235813) or a thermal decomposition method. The through holes 30 are the pores separated by the cutting. The porous material cut out from the lotus-type porous metal molded body is used in this way, thereby easily obtaining, at low cost, the metal porous body 6 provided with a large number of through holes extending in one direction.

The metal porous body 3 has a flat plate shape with a relatively small dimension in the direction along which the through holes 30 extend, but the metal porous body 3 may of course be configured in various other shapes.

Figure 6:
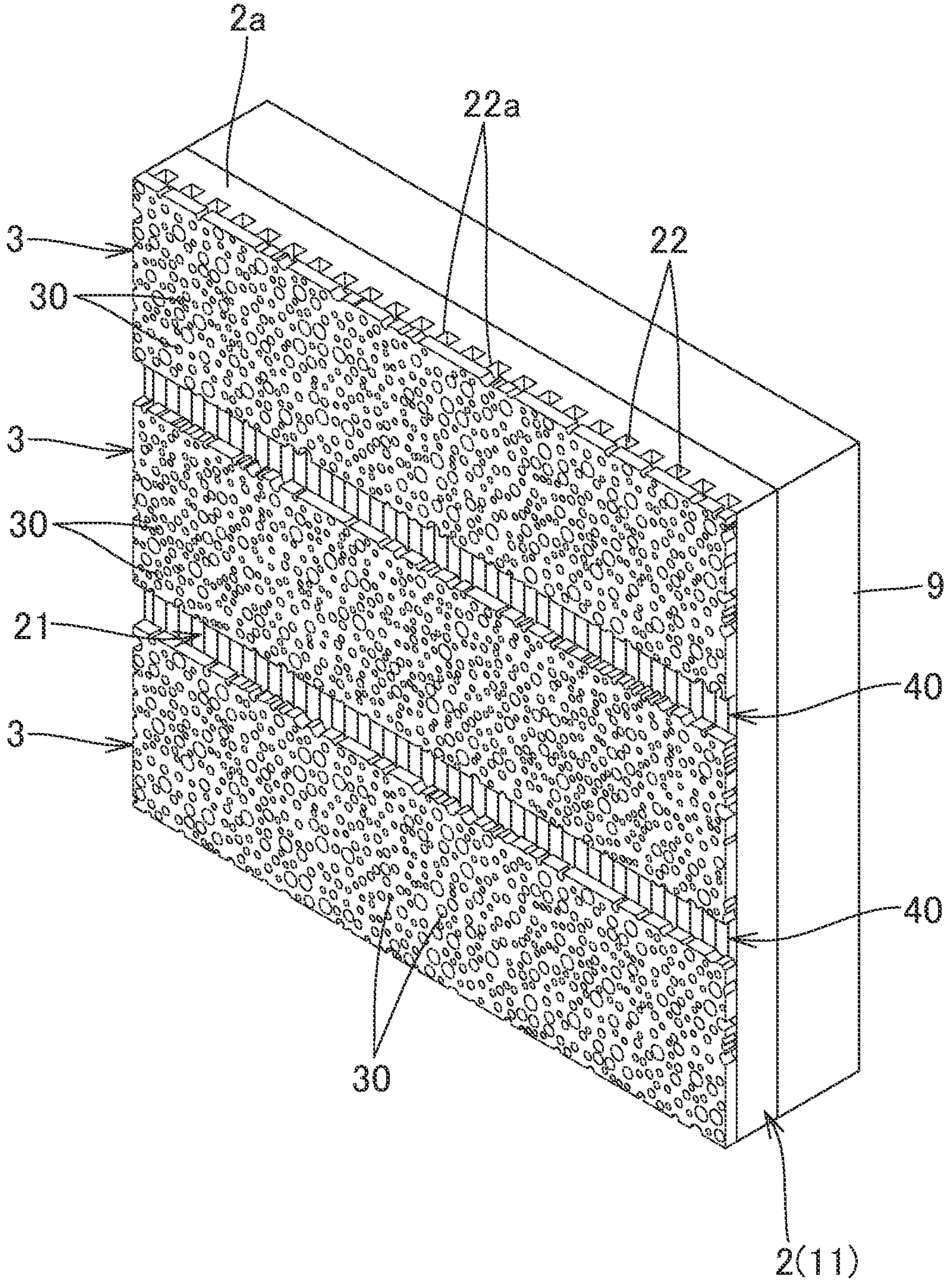
FIG. 6 is an explanatory diagram showing movement of a refrigerant in a modified example of the heat receiving portion according to the present invention.
Figure 7:
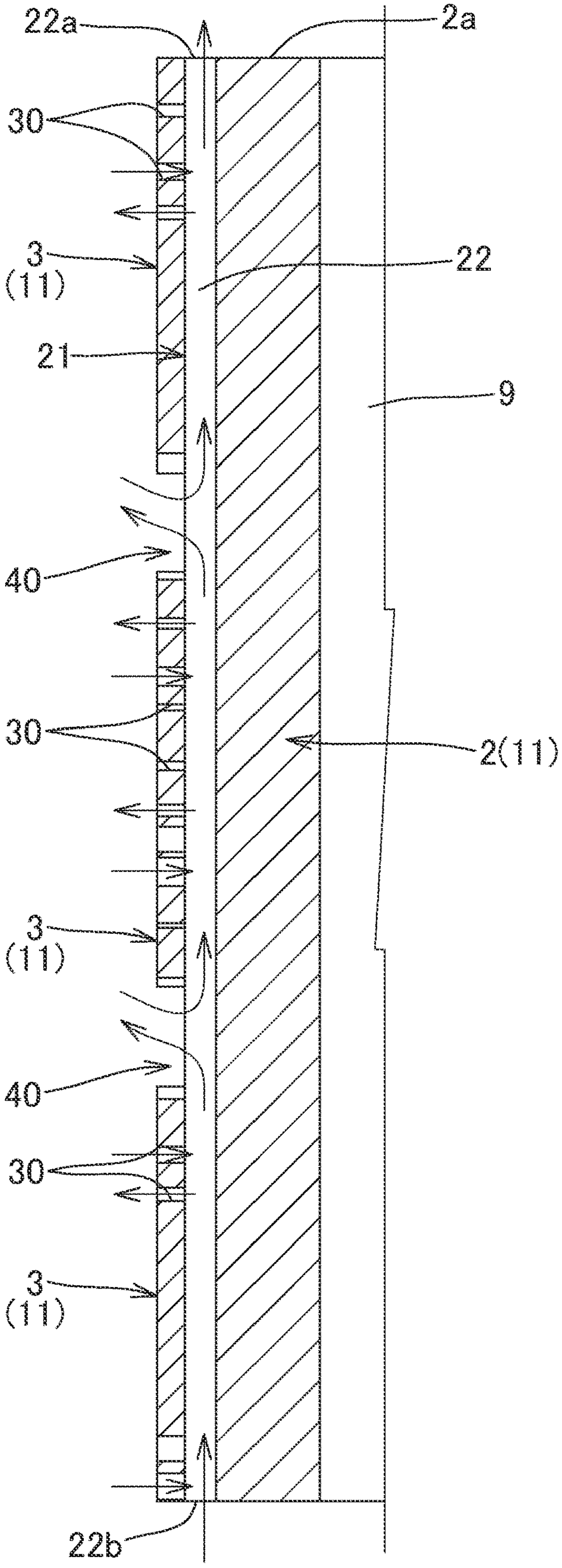
FIG. 7 is an explanatory diagram showing the movement of the refrigerant in the heat receiving portion according to the modified example.

Only one metal porous body 3 is provided to cover all the uneven surface 21 except the opposite ends of the grooves 22, in a state where the opposite ends are opened. Here, as shown in FIGS. 6 and 7, a plurality of metal porous bodies 3 may be arranged side by side with a gap 40 therebetween. Accordingly, open portions of the grooves 22 can be provided not only at the opposite ends but also in the gap 40 in the middle, making it possible to smoothly supply the refrigerant liquid and to discharge the vapor. This enhances the cooling efficiency.

Although the embodiments of the present invention have been described above, the present invention is not limited to these embodiments, and the present invention can be implemented in various forms without departing from the gist of the present invention.

REFERENCE SIGNS LIST

1 ebullition cooling device
10 refrigerant liquid
11 heat receiving portion
12 heat radiating portion
2 heat transfer wall
2*a* upper end portion
20 attachment surface
21 uneven surface
22 grooves
22*a* upper end
22*b* lower end
3 metal porous body
30 through hole
7 storage container
8 condensation pipe
9 cooling target object

The invention claimed is:

1. An ebullition cooling device including: a heat receiving portion to which a cooling target object is attached; and a heat radiating portion to which heat is transmitted by ebullition and evaporation of a refrigerant liquid in contact with the heat receiving portion, wherein
the heat receiving portion includes:
a heat transfer wall having an attachment surface to which the cooling target object is attached and an uneven surface having a plurality of grooves provided in a region excluding the attachment surface; and
a metal porous body attached to and completely superimposed on the uneven surface of the heat transfer wall, the metal porous body having a plurality of through holes formed therein, one opening of each of the through holes facing the uneven surface, and the other opening of each of the through holes being opened to a space on a side opposite to the uneven surface,
at least the uneven surface of the heat transfer wall and the metal porous body are immersed in the refrigerant liquid, and
the uneven surface of the heat transfer wall is a vertical surface or an inclined surface having a height position that changes in one direction along which the grooves extend, and at least one end, at a higher position, of opposite ends of each of the grooves in the direction along which the grooves extend is opened.

2. The ebullition cooling device according to claim 1, wherein
the uneven surface includes the plurality of grooves extending mutually in parallel, and the metal porous body is attached to the uneven surface with the opposite ends of the grooves being opened.

3. The ebullition cooling device according to claim 1,
wherein the metal porous body is a porous metal molded body molded by a metal solidification method, the porous metal molded body having a plurality of pores that extend in one direction.

4. The ebullition cooling device according to claim 2,
wherein the metal porous body is a porous metal molded body molded by a metal solidification method, the porous metal molded body having a plurality of pores that extend in one direction.

* * * * *